(12) United States Patent
Tsai et al.

(10) Patent No.: US 8,952,749 B1
(45) Date of Patent: Feb. 10, 2015

(54) FILTER WITH COMBINED RESONATOR AND INTEGRATOR

(71) Applicant: Mediatek Inc., Hsin-Chu (TW)

(72) Inventors: Hung-Chieh Tsai, Tainan (TW);
Chen-Yen Ho, New Taipei (TW);
Yu-Hsin Lin, Taipei (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/038,759

(22) Filed: Sep. 27, 2013

(51) Int. Cl.
*H04B 1/10* (2006.01)
*H03H 11/04* (2006.01)

(52) U.S. Cl.
CPC .................. *H03H 11/0405* (2013.01)
USPC ........................................................ 327/556

(58) Field of Classification Search
USPC .................. 327/551, 552, 556, 557, 558, 559
See application file for complete search history.

(56) References Cited

U.S. PATENT DOCUMENTS

| | | | | |
|---|---|---|---|---|
| 5,635,871 | A * | 6/1997 | Cavigelli | 330/107 |
| 7,075,364 | B2 * | 7/2006 | Gudem et al. | 327/552 |
| 7,345,540 | B2 * | 3/2008 | Chang et al. | 330/207 A |
| 7,852,147 | B1 * | 12/2010 | Mirzaei et al. | 327/553 |
| 8,410,962 | B2 * | 4/2013 | Shibata et al. | 341/143 |
| 8,436,679 | B1 * | 5/2013 | Alzaher et al. | 327/556 |

OTHER PUBLICATIONS

Kazuo Matsukawa, A 69.8 dB SNDR 3rd-order Continuous Time Delta-Sigma Modulator with an Ultimate Low Power Tuning System for a Worldwide Digital TV-Receiver, Sep. 19, 2010.

* cited by examiner

*Primary Examiner* — Jeffrey Zweizig
(74) *Attorney, Agent, or Firm* — Winston Hsu; Scott Margo (57) ABSTRACT

A filter comprises an integrator, a signal feeding path, a first operational amplifier and a second capacitor. The integrator comprises a first input terminal and a first output terminal. The signal feeding path comprises: a first resistor, having a first terminal coupled to the first output terminal; a first capacitor, having a first terminal coupled to the second terminal of the first resistor; and a second resistor, having a first terminal coupled to the integrator and having a second terminal coupled to the second terminal of the first capacitor. The first operational amplifier comprises a second input terminal coupled to the second terminal of the first resistor and the first terminal of the first capacitor, and comprises a second output terminal. The second capacitor comprises a first terminal coupled to the second terminal of the first capacitor, and comprises a second terminal coupled to the second output terminal.

19 Claims, 7 Drawing Sheets

FILTER WITH COMBINED RESONATOR AND INTEGRATOR

BACKGROUND

A continuous-time delta-sigma ADC (Analog to Digital Converter) always includes a resonator having a single op-amp (operational amplifier). The resonator determines notch points that can suppress noise. However, the notch points are determined by gain values for the op-amp included in the resonator, and it is difficult to achieve high gain via single op-amp. The performance loss due to finite op-amp gain may no longer be neglected for high dynamic range device.

Figure 1:
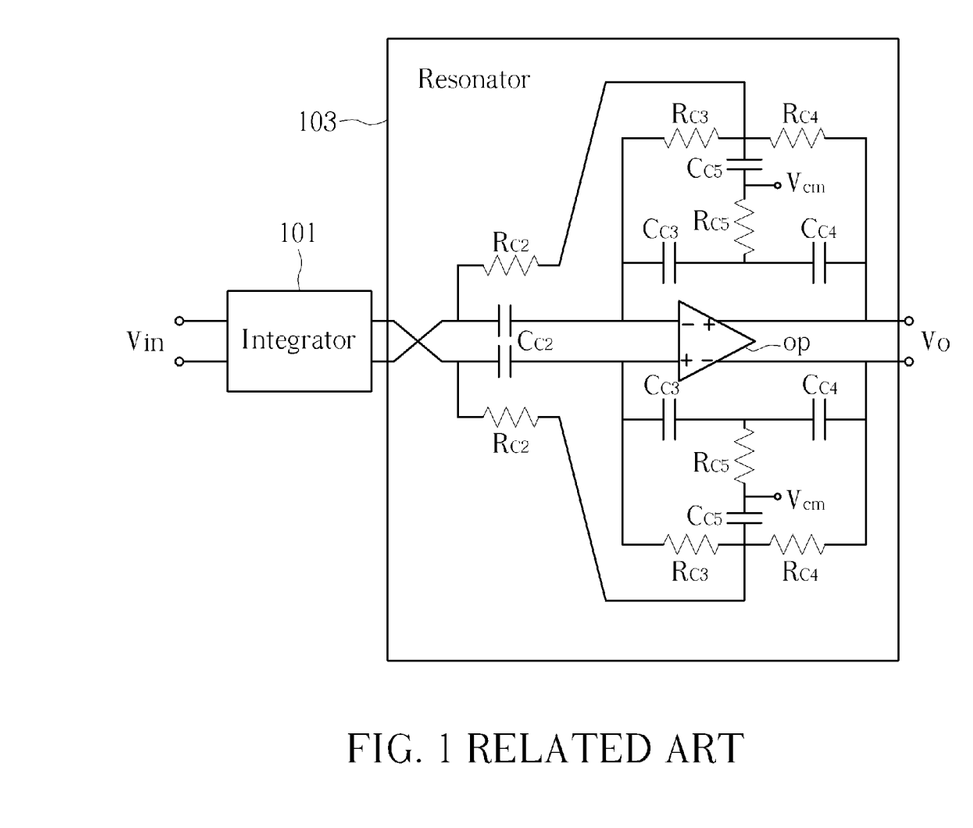
FIG. 1 is a circuit diagram illustrating a related art resonator having a single operational amplifier.

FIG. 1 is a circuit diagram illustrating a related art resonator having a single operational amplifier. As shown in FIG. 1, the input signal $V_{1n}$ has been processed by the integrator 101 before enters the resonator 103. The resonator 103 includes an op-amp OP and a plurality of resistors $R_{C2}$-$R_{C5}$ and $C_{C2}$-$C_{C5}$. As above-mentioned description, high gain can not be provided by only one op-amp, thus the resonator 103 has above-mentioned disadvantage. Some related arts provide resonators having more than one op-amps, such resonator also occupies a large circuit region, however.

SUMMARY

Therefore, one objective of the present application is to provide a filter (e.g., a delta-sigma modulator) that can provide high gain via utilizing less operational amplifiers. By structurally combining a resonator and an integrator, the proposed filter can have n-th order while less than n op-amps are required. For example, a $3^{rd}$ order loop filter with only two op-amps can be achieved. The power dissipation and performance are thus improved.

One embodiment of the present application discloses a filter, which comprises an integrator, a signal feeding path, a first operational amplifier and a second capacitor. The integrator comprises a first input terminal and a first output terminal. The signal feeding path comprises: a first resistor, having a first terminal coupled to the first output terminal, and having a second terminal; a first capacitor, having a first terminal coupled to the second terminal of the first resistor, and having a second terminal; and a second resistor, having a first terminal coupled to the integrator and having a second terminal coupled to the second terminal of the first capacitor. The first operational amplifier comprises a second input terminal coupled to the second terminal of the first resistor and the first terminal of the first capacitor, and comprising a second output terminal. The second capacitor comprises a first terminal coupled to the second terminal of the first capacitor, and comprising a second terminal coupled to the second output terminal. Such embodiment can be varied to process differential input.

Another embodiment of the present application discloses a filter comprising a first operational amplifier, a first resistor a first capacitor, a signal feeding path and an integrator. The first operational amplifier comprises a first op-amp input terminal and a first op-amp output terminal. The first resistor comprise a first terminal coupled to a first input terminal, and comprises a second terminal coupled to the first op-amp input terminal. The first capacitor comprises a first terminal coupled to the second terminal of the first resistor, and comprises a second terminal. The signal feeding path comprises a second capacitor having a first terminal coupled to the second terminal of the first capacitor and having a second terminal coupled to the first op-amp output terminal; and a second resistor, having a first terminal coupled to the second terminal of the first capacitor, and having a second terminal coupled to the integrator. The integrator comprises a second input terminal coupled to the first op-amp output terminal and comprises a first output terminal. Such embodiment can be varied to process differential input.

In view of above-mentioned embodiments, a resonator can be formed based on a single op-amp and a part of circuit of an integrator, thus high gain can be acquired and the problem of large circuit region can be avoided.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
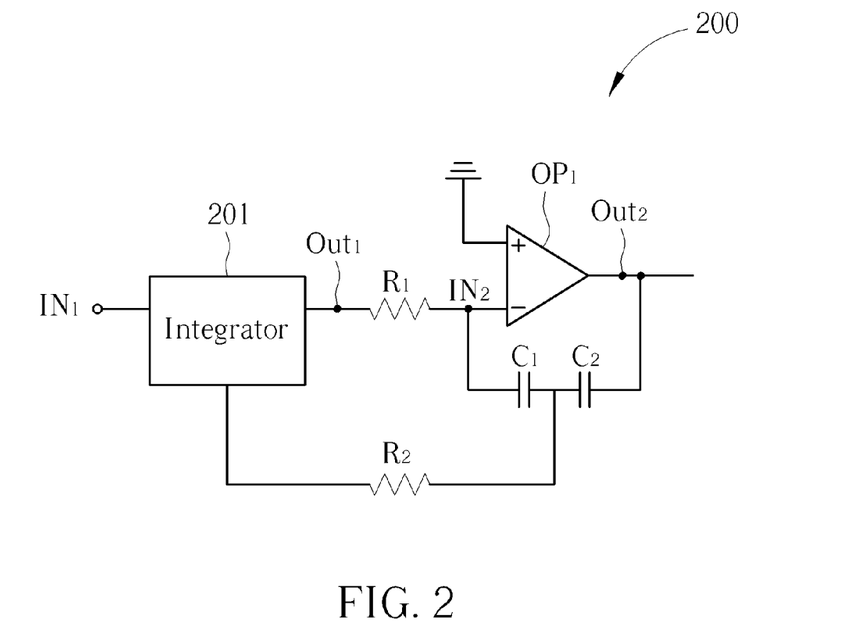
FIG. 2 is a circuit diagram illustrating a filter having a single ended input and output, according to one embodiment of the present application.

The filter disclosed by the present application is detailedly explained in the following description, but please note that the filter disclosed by the present application can be utilized to provide other functions besides the continuous-time sigma-delta modulator. FIG. 2 is a circuit diagram illustrating a filter 200 having a single-ended input and output, according to one embodiment of the present application. As shown in FIG. 2, the filter 200 comprises an integrator 201, a RC path comprising a resistor $R_1$, a capacitor $C_1$ and a resistor $R_2$, an operational amplifier $OP_1$, and a capacitor $C_2$.

For more detail, the integrator 201 comprises an input terminal $IN_1$ and an output terminal $Out_1$. The resistor $R_1$ has a first terminal coupled to the output terminal $Out_1$, and has a second terminal. The capacitor $C_1$ has a first terminal coupled to the second terminal of the resistor $R_1$, and has a second terminal. The resistor $R_2$ has a first terminal coupled to the integrator 201 and has a second terminal coupled to the second terminal of the capacitor $C_1$. The operational amplifier $OP_1$ comprises an input terminal $IN_2$ coupled to the second terminal of the resistor $R_1$ and the first terminal of the capacitor $C_1$, and comprises another output terminal $Out_2$. The capacitor $C_2$ comprises a first terminal coupled to the second terminal of the capacitor $C_1$, and comprises a second terminal coupled to the output terminal $Out_2$. Please note some terminals in FIG. 2 and the following figures are not marked by symbols for simplicity of drawings, for example, the first, second terminals of the resistor $R_1$, $R_2$, $C_1$. Persons skilled in the art can easily understand the meaning via the figures and the description thereof.

If a signal is transmitted to the input terminal $IN_1$, the signal is processed by the integrator 201 and then processed by another integrator stage formed by the operational amplifier $OP_1$, the resistor $R_1$, and the capacitors $C_1$, $C_2$. Moreover, the output signal from the output terminal $Out_1$ is also transmitted back to the integrator 201 via the RC signal feeding path comprising the resistor $R_1$, the capacitor $C_1$ and the resistor $R_2$. The integrator 201, the RC signal feeding path and the operational amplifier $OP_1$ together provide functionalities of a resonator. Therefore, the signal at the output terminal $Out_2$ is generated not only based on the signal transmitted to the input terminal $IN_1$ but also the signal feed backed via the signal feeding path. Under this circuit structure, a high gain may be acquired while power dissipation is also suppressed.

Figure 3:
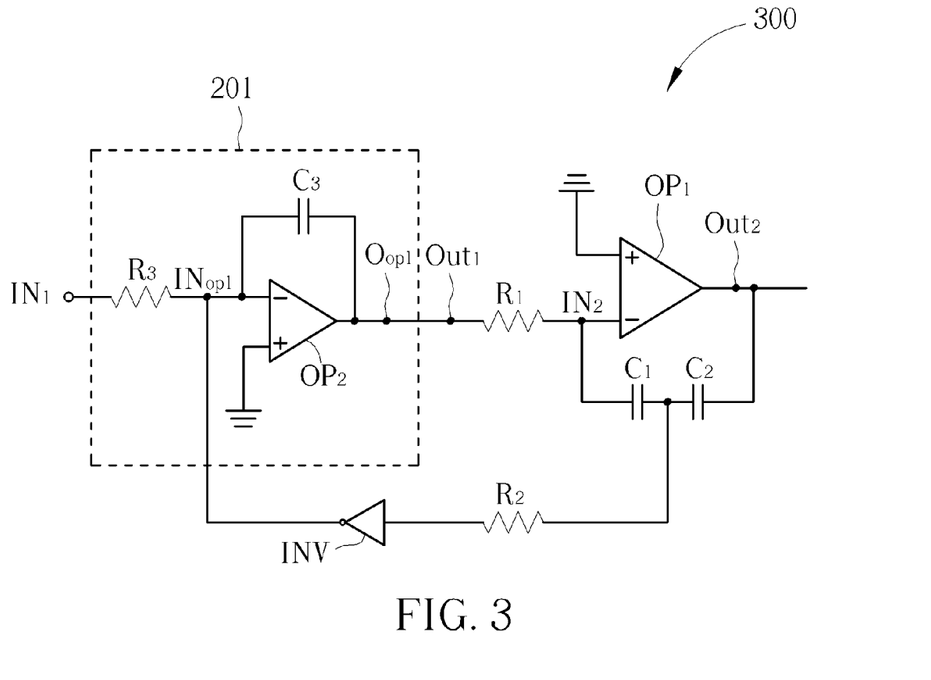
FIG. 3 is an example of a detail circuit structure for the embodiment illustrated in FIG. 2.

FIG. 3 is an example of a detail circuit structure for the embodiment illustrated in FIG. 2. As shown in FIG. 3, the integrator 201 comprises: an operational amplifier $OP_2$, a capacitor $C_3$, and a resistor $R_3$. The operational amplifier $OP_2$ comprises an op-amp output terminal $O_{OP1}$ served as the output terminal $Out_1$, and an op-amp input terminal $IN_{OP1}$. The capacitor $C_3$ comprises a first terminal coupled to the op-amp input terminal $IN_{OP1}$ and comprises a second terminal coupled to the output terminal $Out_1$. The resistor $R_3$ comprises a first terminal coupled to the input terminal $IN_1$, and comprises a second terminal coupled to the op-amp input terminal $IN_{OP1}$.

In this embodiment, the op-amp input terminal $IN_{OP1}$ has a polarity opposite to which of the output terminal $Out_1$. The input terminal $IN_2$ receives a signal having a polarity the same as which of the signal output by the output terminal $Out_1$. Therefore, in this embodiment, the filter 200 further comprises an inverter INV. The inverter INV is provided between the resistor $R_2$ and the op-amp input terminal $IN_{OP1}$, to invert output from the first terminal of the resistor $R_2$ to the op-amp input terminal $IN_{OP1}$. However, the inverter INV may be omitted if the integrator 201 has different structures (an example will be given later).

The frequency response of the integrator 201 in FIG. 3 is $$\frac{K_0}{S}$$

and the frequency response for the operational amplifier $OP_1$, resistors $R_1$, $R_2$ and capacitors $C_1$, $C_2$ is $$K_1 \frac{K_2 S + K_3}{S^2}.$$

Also, the frequency response for the whole circuit in FIG. 3 is $$\frac{K_4 + K_5 S}{S(S^2 + W_0^2)}.$$

In the above-mentioned frequency response equations, $$K_0 = \frac{1}{R_3 C_3}, K_1 = 1,$$

$$K_2 = \frac{(C_1 + C_2)}{R_1 \times C_1 \times C_2},$$

$$K_3 = \frac{1}{R_1 \times R_2 \times C_1 \times C_2},$$

$$K_4 = \frac{1}{R_1 \times R_2 \times R_3 \times C_1 \times C_2 \times C_3},$$

$$K_5 = \frac{C_1 + C_2}{R_1 \times R_3 \times C_1 \times C_2 \times C_3},$$

$$W_0 = \left(\frac{1}{R_1 \times R_2 \times C_1 \times C_3}\right)^{0.5}.$$

The notch point of the filter 300 is determined by the resistors $R_1$, $R_2$ and capacitors $C_1$, $C_3$. The notch shape is sharp enough because it implements the resonator with two op-amps $OP_1$, $OP_2$. As can be seen, by structurally combining resonator and integrator, the filter 300 has 3-rd order while only two op-amps are utilized. The power dissipation and resonator performance are thus improved.

Figure 4:
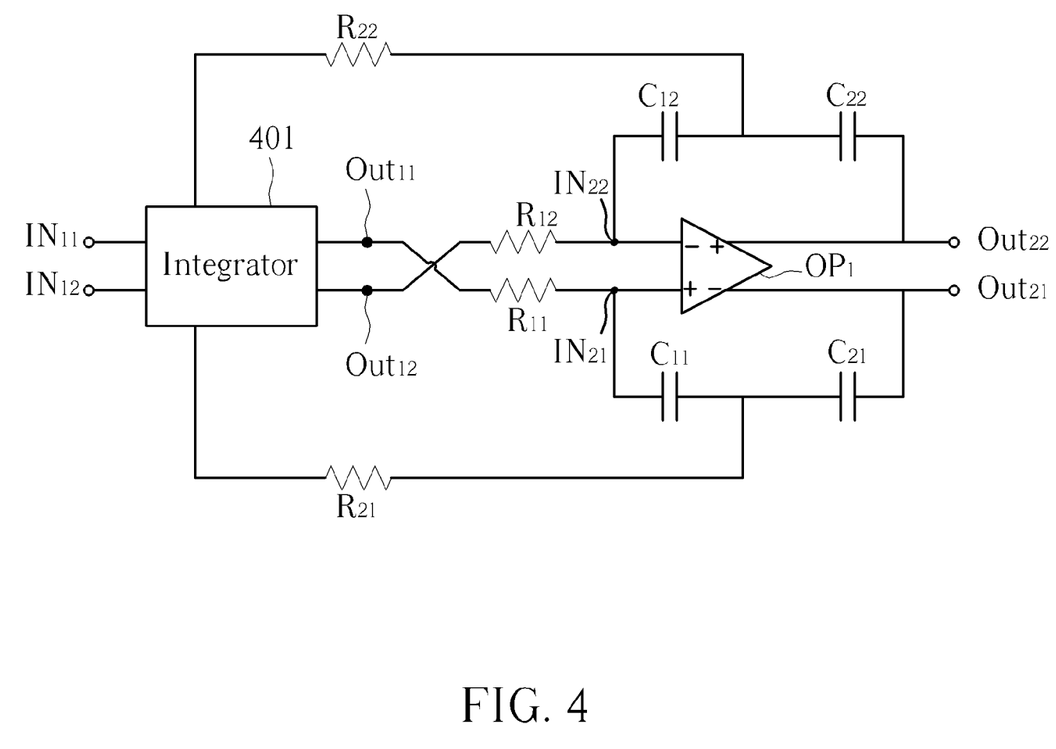
FIG. 4 is a circuit diagram illustrating a filter having a differential input and output, according to one embodiment of the present application.

FIG. 4 is a circuit diagram illustrating a filter having a differential input and output, according to one embodiment of the present application. In FIG. 4, the integrator 401, the resistor $R_{11}$, the capacitor $C_{11}$, the resistor $R_{21}$, the operational amplifier $OP_1$, and the capacitor $C_{21}$ have similar arrangements of the integrator 201, the resistor $R_1$, the capacitor $C_1$, the resistor $R_2$, the operational amplifier $OP_1$, and the capacitor $C_2$ in FIG. 2. The resistor $R_{12}$, the capacitor $C_{12}$, the resistor $R_{22}$, and the capacitor $C_{22}$ have an arrangement symmetric with the resistor $R_{11}$, the capacitor $C_{11}$, the resistor $R_{21}$ and the capacitor $C_{21}$.

Figure 5:
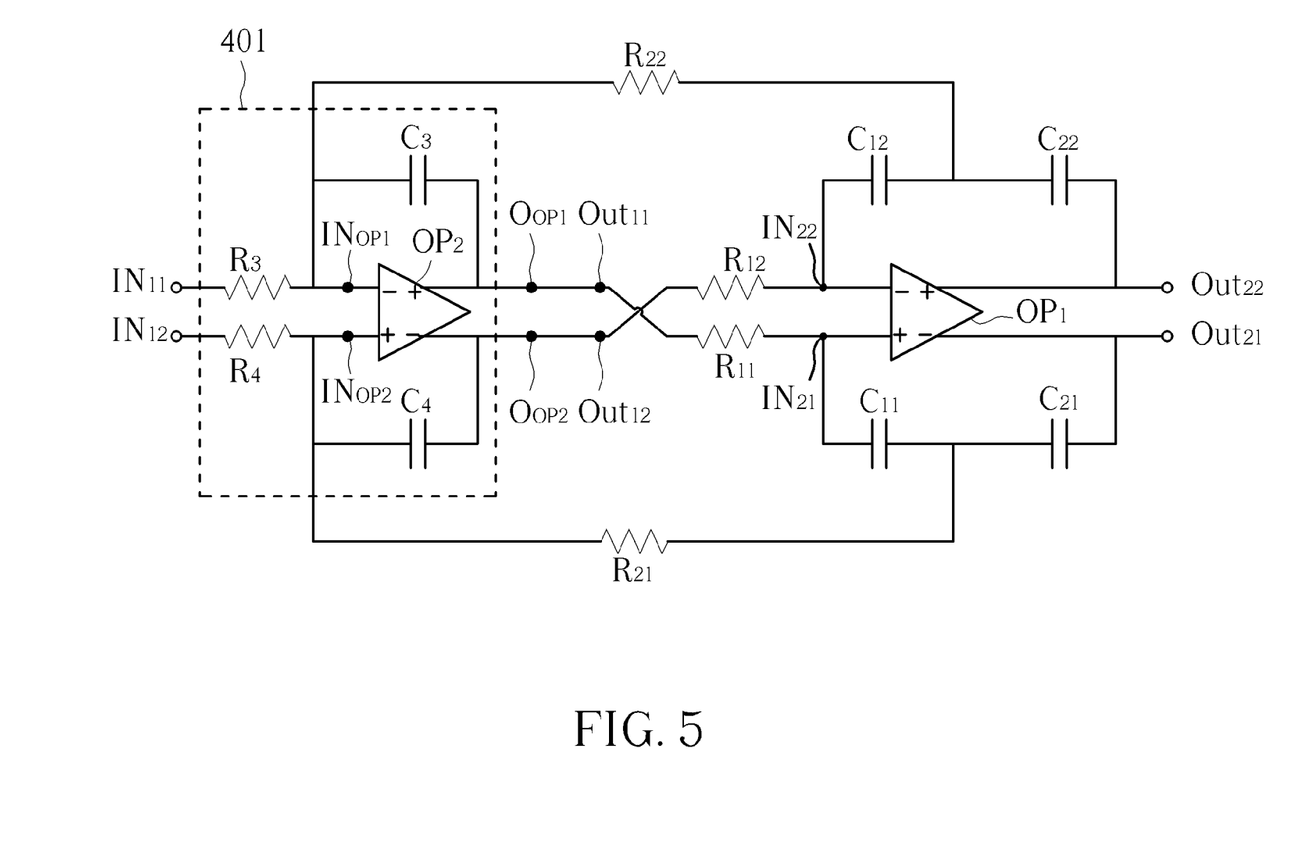
FIG. 5 is an example of a detail circuit structure for the embodiment illustrated in FIG. 4.

FIG. 5 is an example of a detail circuit structure for the embodiment illustrated in FIG. 4. As shown in FIG. 5, the integrator 401 comprises: an amplifier $OP_2$, resistors $R_3$, $R_4$, and capacitors $C_3$, $C_4$. The operational amplifier $OP_2$ comprises op-amp input terminals $IN_{OP1}$, $IN_{OP2}$, and op-amp output terminals $O_{OP1}$, $O_{OP2}$. In this embodiment, the op-amp output terminal $O_{OP1}$ serves as the output terminal $Out_{11}$ and the op-amp output terminal $O_{OP2}$ serves as the output terminal $Out_{12}$. The capacitor $C_3$ comprises a first terminal coupled to the op-amp input terminals $IN_{OP1}$ and the first terminal of the resistor $R_{22}$, and comprises a second terminal coupled to the output terminal $Out_{11}$. The resistor $R_3$ comprises a first terminal coupled to the input terminal $IN_{11}$, and comprises a second terminal coupled to the op-amp input terminal $IN_{OP1}$. The capacitor $C_4$ comprises a first terminal coupled to the op-amp input terminals $IN_{OP2}$ and the first terminal of the resistor $R_{21}$, and comprises a second terminal coupled to the output terminal $Out_{12}$. The resistor $R_4$ comprises a first terminal coupled to the input terminal $IN_{12}$, and comprises a second terminal coupled to the op-amp input terminal $IN_{OP2}$. Since the op-amps have differential structure, the inverter INV shown in FIG. 3 can be omitted. To be more detailed, a negative signal feedback path is formed from the positive op-amp output terminal $O_{OP1}$ to the negative op-amp output terminal $O_{OP2}$, through the resistor $R_{11}$, the capacitor $C_{11}$, the resistor $R_{21}$, and the capacitor $C_4$, and another negative signal feedback path is formed from the negative op-amp output terminal $O_{OP2}$ to the positive op-amp output terminal $O_{OP1}$, through the resistor $R_{12}$, the capacitor $C_{12}$, the resistor $R_{22}$, and the capacitor $C_3$. The op-amp input terminals $IN_{OP1}$ has a polarity opposite to which of the output terminal $Out_{11}$, the op-amp input terminals $IN_{OP2}$ has a polarity opposite to which of the output terminal $Out_{12}$, the input terminal $IN_{21}$ receives a signal having a polarity to the same as which of a signal output by the output terminal $Out_{11}$, and the input terminal $IN_{22}$ receives a signal having a polarity the same as which of the signal output by the output terminal $Out_{12}$. The notch point of the filter is determined by the impedance values of the resistor $R_{11}$, the capacitor $C_{11}$, the resistor $R_{21}$, the capacitor $C_4$, the resistor $R_{12}$, the capacitor $C_{12}$, the resistor $R_{22}$, and the capacitor $C_3$.

In one embodiment, the resistors $R_{11}$, $R_{12}$ have substantially the same resistance value, the capacitor $C_{11}$, $C_{12}$ have substantially the same capacitance value, the resistors $R_{21}$, $R_{22}$ have substantially the same resistance value. The capacitors $C_3$ and $C_4$ have substantially the same capacitance value. Therefore, the frequency response thereof will be similar to which in FIG. 3. That is, the notch shape is sharp enough since the resonator is implemented by two op-amps $OP_1$, $OP_2$, and by structurally combining resonator and integrator, the differential filter shown in FIG. 4 or FIG. 5 has 3-rd order while only two op-amps are utilized. The power dissipation and resonator performance are thus improved.

Figure 6:
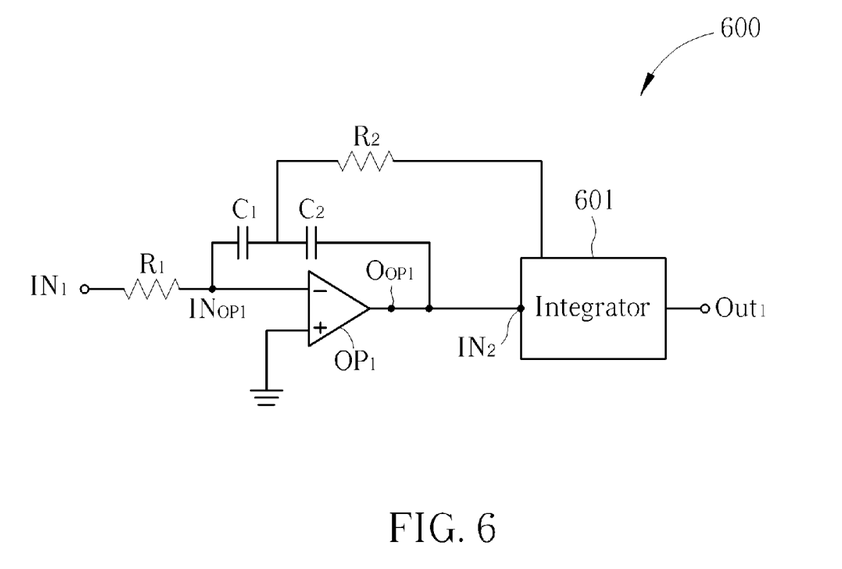
FIG. 6 is a circuit diagram illustrating a filter having a single ended input and output, according to another embodiment of the present application.

The arrangements for the embodiments shown in FIG. 2-FIG. 5 can be swapped. FIG. 6 is a circuit diagram illustrating a filter having a single ended input and output, according to another embodiment of the present application. As shown in FIG. 6, the filter 600 comprises: an operational amplifier $OP_1$, resistors $R_1$, $R_2$ capacitors $C_1$, $C_2$ and an integrator 601. The operational amplifier $OP_1$ comprises an op-amp input terminal $IN_{OP1}$ and an op-amp output terminal $O_{OP1}$. The resistor $R_1$ has a first terminal coupled to an input terminal $IN_1$, and has a second terminal coupled to the op-amp input terminal $IN_{OP1}$. The capacitor $C_1$ has a first terminal coupled to the second terminal of the resistor $R_1$, and has a second terminal. The resistor $R_2$ has a first terminal coupled to the second terminal of the capacitor $C_1$, and has a second terminal coupled to the integrator 601. The capacitor $C_2$ has a first terminal coupled to the second terminal of the capacitor $C_1$ and has a second terminal coupled to the op-amp output terminal $O_{OP1}$. The integrator 601 comprises an input terminal $IN_2$ coupled to the op-amp output terminal $O_{OP1}$ and comprises an output terminal $Out_1$.

In the embodiment of FIG. 6, the signal inputted to the input terminal $IN_1$ is processed by an integrator formed by the operational amplifier $OP_1$, the resistor $R_1$, capacitors $C_1$, $C_2$ and then transmitted to the input terminal $IN_2$. Also, there is a signal feeding path comprising resistor $R_2$ and the capacitor $C_2$. The integrator 601, the signal feeding path (e.g., $R_2$, $C_2$) and the operational amplifier $OP_1$ together provide functionalities of a resonator. Therefore, similar performance can be obtained as compared with the above embodiments.

Figure 7:
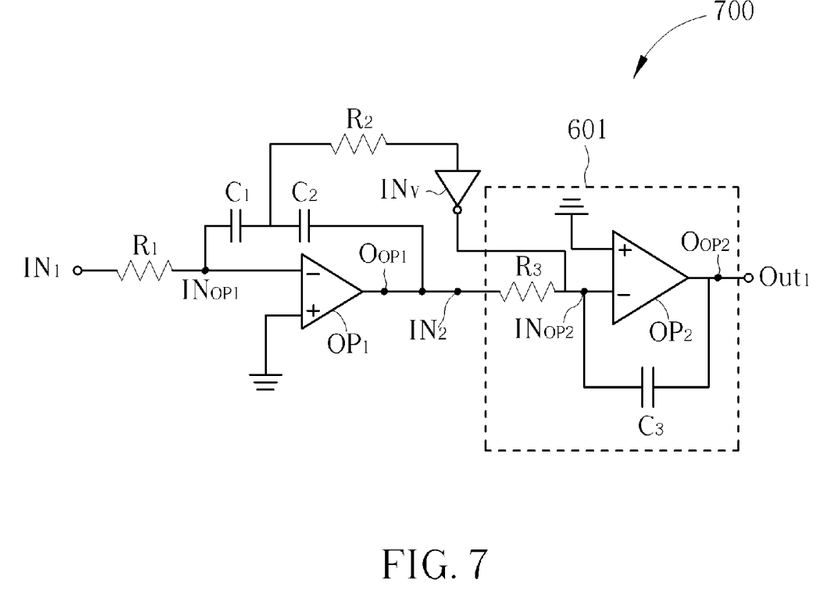
FIG. 7 is an example of a detail circuit structure for the embodiment illustrated in FIG. 6.

FIG. 7 is an example of a detail circuit structure for the embodiment illustrated in FIG. 6. As shown in FIG. 7, the integrator 601 comprises an operational amplifier $OP_2$, a capacitor $C_3$, and a resistor $R_3$. The second operational amplifier $OP_2$ comprises an op-amp output terminal $O_{OP2}$ served as the output terminal $Out_1$, and an op-amp input terminal $IN_{OP2}$. The capacitor $C_3$ comprises a first terminal coupled to the op-amp input terminal $IN_{OP2}$ and comprises a second terminal coupled to the first output terminal $Out_1$. The third resistor $R_3$ comprises a first terminal coupled to the input terminal $IN_2$, and comprises a second terminal coupled to the op-amp input terminal $IN_{OP2}$. In this embodiment, the filter 700 further comprises an inverter INV. The inverter INV is provided between the resistor $R_2$ and the op-amp input terminal $IN_{OP2}$, to invert output from the second terminal of the resistor $R_2$ to the op-amp input terminal $IN_{OP2}$. The frequency response for the circuit in FIG. 7 is the same as which of the embodiment in FIG. 3, thus it is omitted for brevity here.

Figure 8:
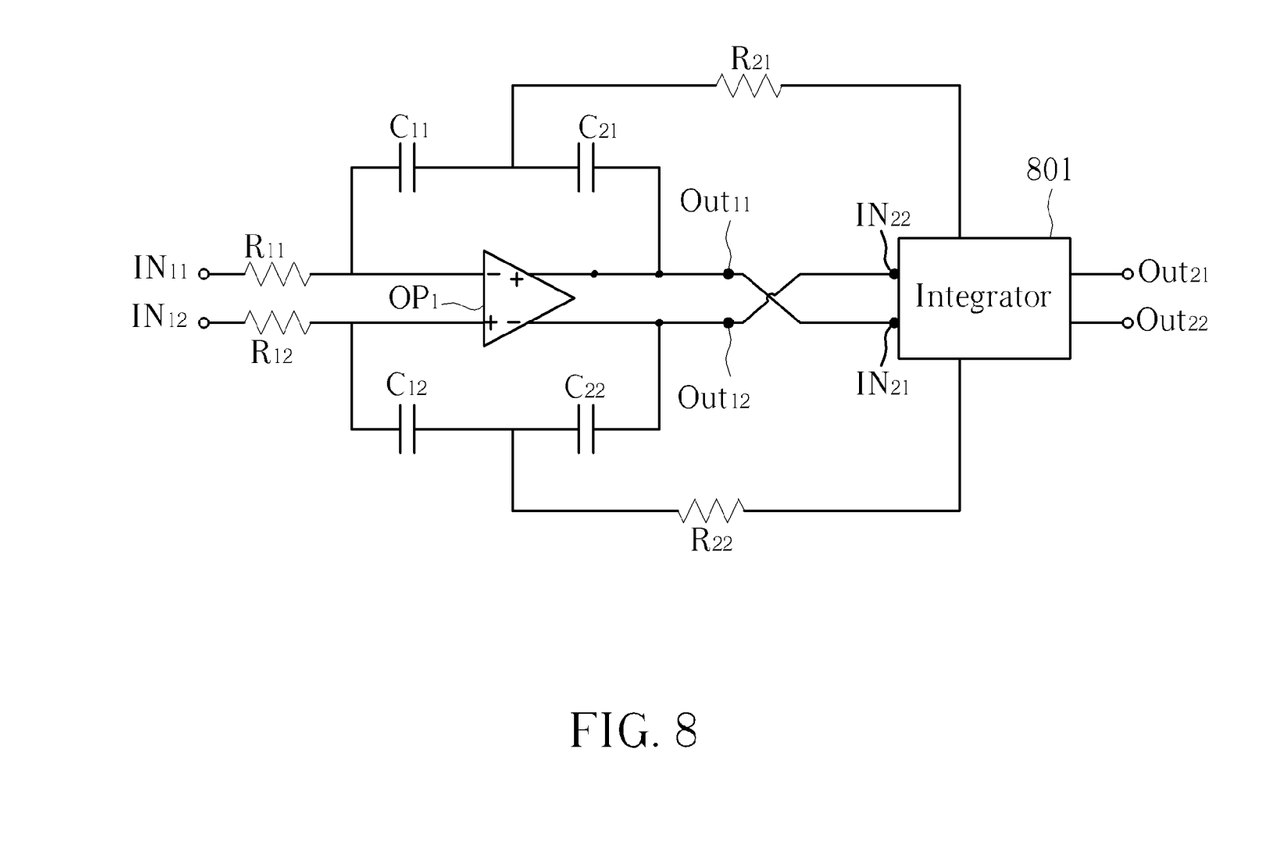
FIG. 8 is a circuit diagram illustrating a filter having a differential input and output, according to another embodiment of the present application.

FIG. 8 is a circuit diagram illustrating a filter having a differential input and output, according to one embodiment of the present application. The operational amplifier $OP_1$, the resistor $R_{11}$, the capacitor $C_{11}$, the resistor $R_{21}$, the integrator 801, and the capacitor $C_{21}$ in FIG. 8 have similar arrangement as which of the operational amplifier $OP_1$, the resistor $R_1$, the capacitor $C_1$, the resistor $R_2$, the integrator 601, and the capacitor $C_2$ in FIG. 6. The resistor $R_{12}$, the capacitor $C_{12}$, the resistor $R_{22}$, and the capacitor $C_{22}$ have an arrangement symmetric with the resistor $R_{11}$, the capacitor $C_{11}$, the resistor $R_{21}$, and the capacitor $C_{21}$, thus the detail description thereof is omitted for brevity here.

Figure 9:
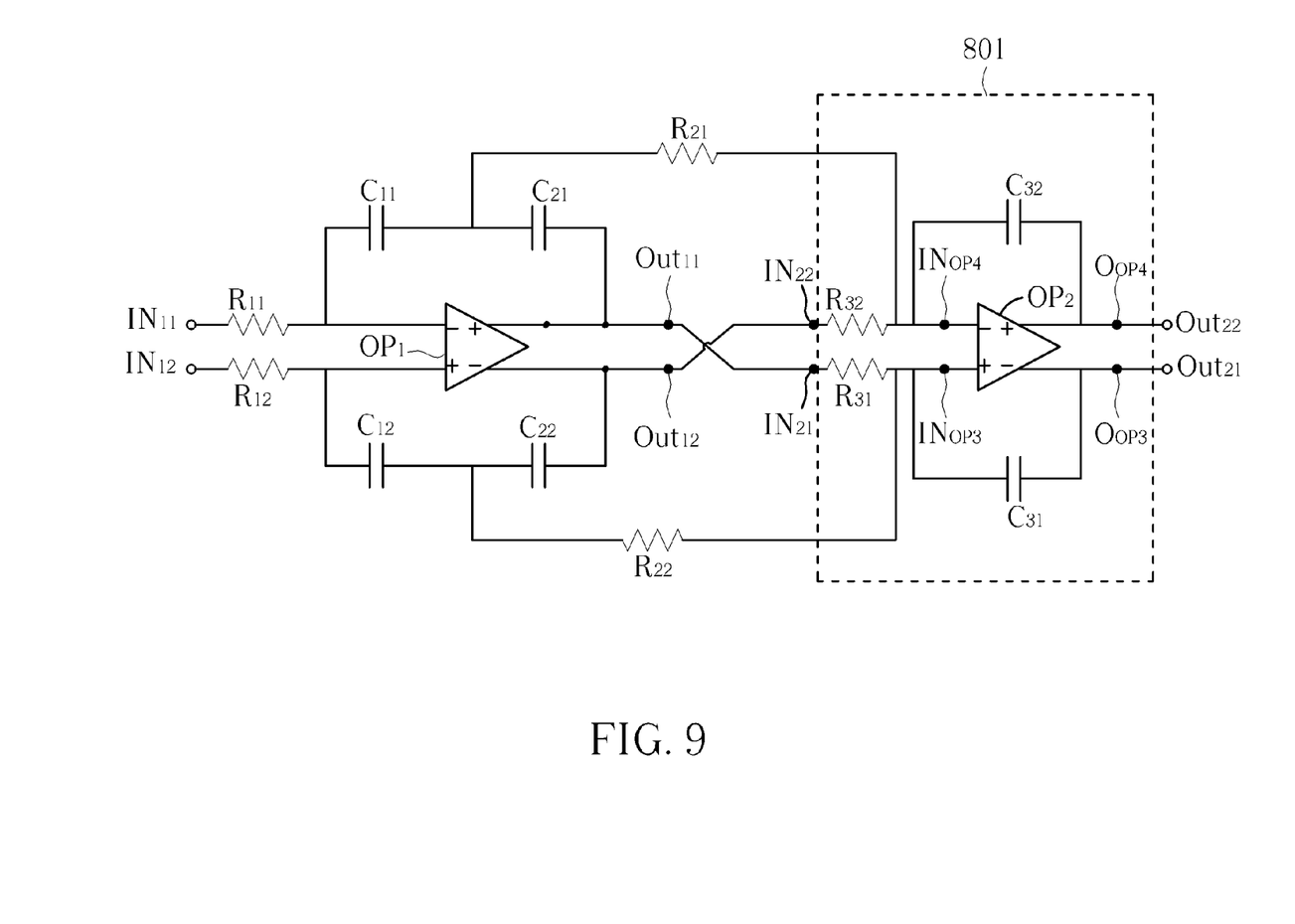
FIG. 9 is an example of a detail circuit structure for the embodiment illustrated in FIG. 8.

FIG. 9 is an example of a detail circuit structure for the embodiment illustrated in FIG. 8. As shown in FIG. 9, the integrator 801 comprises an operational amplifier $OP_2$, resistors $R_{31}$, $R_{32}$, capacitors $C_{31}$, $C_{32}$. The operational amplifier $OP_2$ comprises op-amp input terminals $IN_{OP3}$, $IN_{OP4}$ and op-amp output terminal $O_{OP3}$, $O_{OP4}$. The op-amp output terminal $O_{OP3}$ serves as the output terminal $Out_{21}$, and the op-amp output terminal $O_{OP4}$ serves as the output terminal $Out_{22}$. The capacitor $C_{31}$ comprises a first terminal coupled to the op-amp input terminal $IN_{OP3}$ and comprises a second terminal coupled to the op-amp output terminal $O_{OP3}$. The resistor $R_{31}$ comprises a first terminal coupled to the input terminal $IN_{21}$, and comprises a second terminal coupled to the op-amp input terminal $IN_{OP3}$ coupled to a terminal of the resistor $R_{22}$. The capacitor $C_{32}$ comprises a first terminal coupled to the op-amp input terminal $IN_{OP4}$ and comprises a second terminal coupled to the op-amp output terminal $O_{OP4}$. The resistor $R_{32}$ comprises a first terminal coupled to the input terminal $IN_{22}$, and comprises a second terminal coupled to the op-amp input terminal $IN_{OP4}$ coupled to a terminal of the resistor $R_{21}$.

Since the op-amps have differential structure, the inverter INV shown in FIG. 7 can be omitted. To be more detailed, a negative signal feedback path is formed from the positive op-amp output terminal (e.g, the output terminal $Out_{11}$), through the resistor $R_{31}$, the capacitor $C_{31}$, the resistor $R_{22}$, the capacitor $C_{22}$, to the negative op-amp output terminal (e.g, the output terminal $Out_{12}$), and another negative signal feedback path is formed from the negative op-amp output terminal, through the resistor $R_{32}$, the capacitor $C_{32}$, the resistor $R_{21}$, the capacitor $C_{21}$, to the positive op-amp output terminal. The notch point of the filter is determined by the impedance values of the resistor $R_{31}$, the capacitor $C_{31}$, the resistor $R_{22}$, the capacitor $C_{22}$, the resistor $R_{32}$, the capacitor $C_{32}$, the resistor $R_{21}$, and the capacitor $C_{21}$.

In one embodiment, the resistors $R_{11}$, $R_{12}$ have substantially the same resistance value, the capacitor $C_{11}$, $C_{12}$ have substantially the same capacitance value, the resistors $R_{21}$, $R_{22}$ have substantially the same resistance value. The capacitors $C_{21}$ and $C_{22}$ have substantially the same capacitance value. In such case, the frequency response is similar as which of the embodiment in FIG. 7.

To conclude, the proposed filter may be regarded as comprising a first integrator, a second integrator and an impedance element. The first integrator (such as the integrator 201/401/601/801) comprises a first op-amp (such as $OP_2$), and a first across-network (such as the capacitor $C_3/C_4/C_{31}/C_{32}$) coupling across the first op-amp. The second integrator comprises a second op-amp (such as $OP_1$), and a second across-network (such as the capacitors $C_1$ and $C_2/C_{12}$ and $C_{22}/C_{11}$ and $C_{21}$) coupling across the second op-amp. The impedance element, such as the resistor $R_2/R_{21}/R_{22}$, has a first terminal coupled to a terminal of the first across-network and has a second terminal coupled to an intermediate point of the second across-network. As shown in the embodiments in figures, the second across-network comprises a first impedance network (ex. $C_1$) and a second impedance network (ex. $C_2$), the first impedance network is coupled between an input of the second op-amp and the intermediate point, and the second impedance network is coupled between the intermediate point and an output of the second op-amp.

Also, to put it in another way, the proposed filter can be regarded as comprising a resonator and an integrator. The resonator comprises a first op-amp (ex. $OP_2$), a second op-amp (ex. $OP_1$) and a negative feedback path comprising a plurality of impedance elements so arranged such that at least a notch point is provided. The negative feedback path comprises a first resistor and a first capacitor (ex. $R_1$ and $C_1$ in FIG. 3, or $R_{12}$ and $C_{12}$, or $R_{11}$ and $C_{11}$ in FIG. 5). The integrator comprises the second op-amp (ex. the $OP_1$), the first resistor, the first capacitor and a second capacitor (ex. $C_2$ in FIG. 3, or $C_{22}$, or $C_{21}$ in FIG. 5). The first resistor, the first capacitor and the second capacitor forms at least a portion of a RC network for the integrator.

In view of above-mentioned embodiments, a filter that can provide high gain (e.g., good notch shaping performance) via utilizing less operational amplifiers is achieved. By structurally combining a resonator and an integrator, the proposed filter can have n-th order while less than n op-amps are required. The power dissipation and performance are thus improved, and the problem of large circuit region can be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A filter, comprising:
    an integrator, comprising a first input terminal and a first output terminal;
    a first signal feeding path, comprising:
        a first resistor, having a first terminal coupled to the first output terminal, and having a second terminal;
        a first capacitor, having a first terminal coupled to the second terminal of the first resistor, and having a second terminal; and
        a second resistor, having a first terminal coupled to the integrator and having a second terminal coupled to the second terminal of the first capacitor;
    a first operational amplifier, comprising a second input terminal coupled to the second terminal of the first resistor and the first terminal of the first capacitor, and comprising a second output terminal; and
    a second capacitor, comprising a first terminal coupled to the second terminal of the first capacitor, and comprising a second terminal coupled to the second output terminal.

2. The filter of claim 1, further comprising an inverter, wherein the integrator comprises:
    a second operational amplifier, comprising a op-amp output terminal served as the first output terminal, and a op-amp input terminal;
    a third capacitor, comprising a first terminal coupled to the op-amp input terminal and comprising a second terminal coupled to the first output terminal; and
    a third resistor, comprising a first terminal coupled to the first input terminal, and comprising a second terminal coupled to the op-amp input terminal;
    where the inverter is provided between the second resistor and the op-amp input terminal, to invert output from the first terminal of the second resistor to the op-amp input terminal.

3. The filter of claim 1, wherein the integrator comprises a second operational amplifier having an op-amp input terminal having a polarity opposite to which of the first output terminal, where the second input terminal receives a signal having a polarity the same as which of the signal output by the first output terminal.

4. The filter of claim 1, wherein impedance values of the first resistor, the first capacitor, the second resistor and a capacitor of the integrator determine at least one notch point of the filter.

5. The filter of claim 1, wherein:
    the integrator further comprises a third input terminal and a third output terminal;
    wherein the first operational amplifier further comprises a fourth input terminal and a fourth output terminal;
    wherein the filter further comprises:
    a second signal feeding path, comprising:
        a third resistor, having a first terminal coupled to the third output terminal, and having a second terminal coupled to the fourth input terminal;
        a third capacitor, having a first terminal coupled to the second terminal of the third resistor, and having a second terminal; and
        a fourth resistor, having a first terminal coupled to the integrator and having a second terminal coupled to the second terminal of the third capacitor; and
    a fourth capacitor, comprising a first terminal coupled to the second terminal of the third capacitor, and comprising a second terminal coupled to the fourth output terminal.

6. The filter of claim 5, wherein the integrator further comprises:
    a second operational amplifier, comprising a first op-amp input terminal, a second op-amp input terminal, a first op-amp output terminal, and a second op-amp output terminal, wherein the first op-amp output terminal serves as the first output terminal and the second op-amp output terminal serves as the second output terminal;
    a fifth capacitor, comprising a first terminal coupled to the first op-amp input terminal and the first terminal of the fourth resistor, and comprising a second terminal coupled to the first output terminal;
    a fifth resistor, comprising a first terminal coupled to the first input terminal, and comprising a second terminal coupled to the first op-amp input terminal;
    a sixth capacitor, comprising a first terminal coupled to the second op-amp input terminal and the first terminal of the second resistor, and comprising a second terminal coupled to the second output terminal; and a sixth resistor, comprising a first terminal coupled to the second input terminal, and comprising a second terminal coupled to the second op-amp input terminal.

7. The filter of claim 6, wherein the first op-amp input terminal has a polarity opposite to which of the first output terminal, where the second op-amp input terminal has a polarity opposite to which of the third output terminal, where the second input terminal receives a signal having a polarity the same as which of a signal output by the first output terminal, where the fourth input terminal receives a signal having a polarity the same as which of the signal output by the third output terminal.

8. The filter of claim 5, wherein impedance values of the first resistor, the second resistor, the third resistor, the fourth resistor, the first capacitor, the third capacitor and capacitors of the integrator determine at least one notch point of the filter.

9. The filter of claim 5, wherein the first resistor and the third resistor have substantially the same resistance value, the first capacitor and the third capacitor have substantially the same capacitance value, the second resistor and the fourth resistor have substantially the same resistance value, and the second capacitor and the fourth capacitor have substantially the same capacitance value.

10. A filter, comprising:
a first operational amplifier, comprising a first op-amp input terminal and a first op-amp output terminal;
a first resistor, having a first terminal coupled to a first input terminal, and having a second terminal coupled to the first op-amp input terminal;
a first capacitor, having a first terminal coupled to the second terminal of the first resistor, and having a second terminal;
a first signal feeding path, comprising:
a second capacitor, having a first terminal coupled to the second terminal of the first capacitor and having a second terminal coupled to the first op-amp output terminal; and
a second resistor, having a first terminal coupled to the second terminal of the first capacitor, and having a second terminal coupled to an integrator; and
the integrator, comprising a second input terminal coupled to the first op-amp output terminal and comprising a first output terminal.

11. The filter of claim 10, further comprising an inverter, wherein the integrator comprises:
a second operational amplifier, comprising a second op-amp output terminal served as the first output terminal, and a second op-amp input terminal;
a third capacitor, comprising a first terminal coupled to the second op-amp input terminal and comprising a second terminal coupled to the first output terminal; and
a third resistor, comprising a first terminal coupled to the second input terminal, and comprising a second terminal coupled to the second op-amp input terminal;
where the inverter is provided between the second resistor and the second op-amp input terminal, to invert output from the second terminal of the second resistor to the second op-amp input terminal.

12. The filter of claim 10, wherein impedance values of the second resistor, the second capacitor, and the integrator determine at least one notch point of the filter.

13. The filter of claim 10, wherein the first operational amplifier further comprises a second op-amp input terminal, and a second op-amp output terminal;

wherein the filter further comprises:
a third resistor, having a first terminal coupled to a third input terminal, and having a second terminal coupled to the second op-amp input terminal;
a third capacitor, having a first terminal coupled to the second terminal of the third resistor, and having a second terminal; and
a second signal feeding path, comprising:
a fourth capacitor, having a first terminal coupled to the second terminal of the third capacitor and having a second terminal coupled to the second op-amp output terminal; and
a fourth resistor, having a first terminal coupled to the second terminal of the third capacitor, and having a second terminal coupled to the integrator;
wherein the integrator further comprises a fourth input terminal coupled to the second op-amp output terminal.

14. The filter of claim 13, wherein the integrator comprises:
a second operational amplifier, comprising a third op-amp input terminal, a fourth op-amp input terminal, a third op-amp output terminal and a fourth op-amp output terminal, wherein the third op-amp output terminal serves as the first output terminal, and the fourth op-amp output terminal serves as the second output terminal;
a fifth capacitor comprising a first terminal coupled to the third op-amp input terminal and comprising a second terminal coupled to the third op-amp output terminal; and
a fifth resistor, comprising a first terminal coupled to the second input terminal, and comprising a second terminal coupled to the third op-amp input terminal that is coupled to the second terminal of the fourth resistor;
a sixth capacitor, comprising a first terminal coupled to the fourth op-amp input terminal and comprising a second terminal coupled to the fourth op-amp output terminal; and
a sixth resistor, comprising a first terminal coupled to the fourth input terminal, and comprising a second terminal coupled to the fourth op-amp input terminal that is coupled to the second terminal of the second resistor.

15. The filter of claim 13, wherein impedance values of the second resistor, the fourth resistor, the second capacitor, the fourth capacitor and the integrator determine at least one notch point of the filter.

16. The filter of claim 13, wherein the first resistor and the third resistor have substantially the same resistance value, the first capacitor and the third capacitor have substantially the same capacitance value, the second resistor and the fourth resistor have substantially the same resistance value, the second capacitor and the fourth capacitor have substantially the same capacitance value.

17. A filter, comprising:
a first integrator, comprising a first op-amp and a first across-network coupling across the first op-amp;
a second integrator, comprising a second op-amp and a second across-network coupling across the second op-amp; and
a impedance element having a first terminal coupled to a terminal of the first across-network and having a second terminal coupled to an intermediate point of the second across-network.

18. The filter of claim 17, wherein the second across-network comprises a first impedance network and a second impedance network, the first impedance network is coupled between an input of the second op-amp and the intermediate point, and the second impedance network is coupled between the intermediate point and an output of the second op-amp.

19. A filter, comprising:
- a resonator comprising a first op-amp, a second op-amp and a negative feedback path comprising a plurality of impedance elements so arranged such that at least a notch point is provided, wherein the negative feedback path comprises a first resistor and a first capacitor; and
- an integrator comprising the second op-amp, the first resistor, the first capacitor and a second capacitor, wherein the first resistor, the first capacitor and the second capacitor forms at least a portion of a RC network for the integrator.

* * * * *